United States Patent [19]

Omori et al.

[11] Patent Number: 5,672,220

[45] Date of Patent: Sep. 30, 1997

[54] METHOD OF PRODUCING A LAMINATED ELECTRONIC DEVICE

[75] Inventors: Nagato Omori; Yukio Hamaji; Yoshiaki Mori; Yukio Sakabe, all of Nagaokakyo, Japan

[73] Assignee: Murata Manufacturing Co., Ltd., Japan

[21] Appl. No.: 636,685

[22] Filed: Apr. 23, 1996

Related U.S. Application Data

[63] Continuation of Ser. No. 68,214, May 27, 1993, abandoned.

[30] Foreign Application Priority Data

May 28, 1992 [JP] Japan ................... 4-135467

[51] Int. Cl.$^6$ ................................. C04B 37/00
[52] U.S. Cl. ................... 156/89; 264/61; 264/65
[58] Field of Search ................... 156/89; 264/61, 264/65; 29/25.03; 419/10, 19

[56] References Cited

U.S. PATENT DOCUMENTS

| | | | |
|---|---|---|---|
| 4,766,027 | 8/1988 | Burn | 156/89 |
| 5,164,882 | 11/1992 | Kanai et al. | 264/65 |

FOREIGN PATENT DOCUMENTS 3924563  7/1989  Germany.

Primary Examiner—Christopher A. Fiorilla
Attorney, Agent, or Firm—Ostrolenk, Faber, Gerb & Soffen, LLP

[57] ABSTRACT

A plurality of dielectric ceramic sheets having inner electrodes thereon are laminated and sintered. The ceramic sheets are made of a non-reducing dielectric material, and the inner electrodes are made of a base metal or a base metal alloy. After a binder removing step, the laminate is sintered in a mixed gas which contains either one or both of carbon dioxide with a purity of 99.9% or more and carbon monoxide with a purity of 99.9% or more as its main constituent and further contains hydrogen and oxygen with their densities regulated.

7 Claims, 2 Drawing Sheets

METHOD OF PRODUCING A LAMINATED ELECTRONIC DEVICE

This is a continuation of application Ser. No. 08/068,214 filed on May 27, 1993, now abandoned.

BACKGROUND OF THE INVENTION

1. Field of the Invention

The present invention relates to a method of producing a laminated electronic device, and more particularly to a method of producing a laminated electronic device which is made by sintering a laminate of inner electrodes and ceramic green sheets, such as a laminated ceramic capacitor.

2. Description of Related Art

Generally, a laminate-type ceramic capacitor has a structure in which a specified number of dielectric ceramic sheets and inner electrode sheets are laminated alternately, and a couple of outer electrodes are provided on mutually opposite sides of the laminate. A capacity is generated between two inner electrodes facing each other, and the capacity is taken out via the outer electrodes.

Conventionally, as the material of inner electrodes of such ceramic capacitors, a noble metal, such as palladium, platinum or a mixture of silver and palladium, has been used. However, the use of these expensive noble metals has been an obstruction to reduction of costs.

Recently, in order to solve the problem, an inexpensive base metal has been used for the inner electrodes. Copper and nickel are typical examples. These base metals are also non-migratory and are expected to be used more widely. However, in a high-temperature oxidizing atmosphere, the base metals, such as copper and nickel, are oxidized easily and lose their function as electrodes. Therefore, in a case of using a base metal as inner electrodes of a laminate-type ceramic capacitor, the sintering of the inner electrodes together with dielectric ceramic green sheets must be carried out in a neutral or reducing atmosphere.

For the sintering in a neutral or reducing atmosphere, generally, nitrogen gas or a mixed gas, such as of hydrogen and nitrogen, of carbon monoxide, carbon dioxide and nitrogen, of hydrogen, steam and nitrogen or of carbon dioxide, hydrogen and nitrogen, is used.

In the sintering using such a gas, a desired density of oxygen must be attained by mutual reaction of constituents of the gas. However, in this method, it takes a time to stabilize the density of oxygen in a furnace because it takes a certain time to have an effect brought out by control of the reaction of the constituents. Especially if it is required to heighten the density of oxygen, the reaction of the constituents, which is very slow, must be promoted to produce more oxygen, and accordingly it takes a long time to attain the desired density of oxygen.

The optimal density of oxygen for sintering depends both on conditions of heat treatment to which objects of the sintering were subjected in the previous processes and the volume of the objects. For the above reason, however, it is difficult to regulate the density of oxygen in the furnace accurately. Additionally, impurities contained in the gas make the accurate regulation of the density of oxygen more difficult. Therefore, it is also difficult to regain the same density of oxygen in the furnace.

If an optimal atmosphere for sintering cannot be attained for these reasons, high quality of products cannot be guaranteed by the sintering. More specifically, if the density of oxygen is too high, the inner electrodes are oxidized, which increases the resistance, and/or the material of the inner electrodes diffuses into the dielectric ceramic, which degrades the quality of the dielectric ceramic. If the density of oxygen is too low, the dielectric ceramic is reduced, which lowers the insulation resistance.

SUMMARY OF THE INVENTION

An object of the present invention is to provide a method of producing a laminate-type electronic device which prevents a base-metal or a base-metal alloy, which is the material of inner electrodes, both from being oxidized and from diffusing into ceramic, that is, prevents an increase in the resistance of the inner electrodes, and, accordingly, prevents variations in the capacity, such that the finished electronic devices will be both reliable and high in quality.

In order to attain the object, a method of producing a laminate-type electronic device comprises a step of sintering inner electrodes, made of a base metal or a base-metal alloy, together with ceramic green sheets, in a mixed gas which contains either one or both of carbon dioxide with a purity of 99.9% or more and carbon monoxide with a purity of 99.9% or more as its main constituent(s), and further contains hydrogen and oxygen with their densities regulated.

The sintering step is carried out after decomposing and evaporating a binder by heat.

According to the present invention, a mixed gas including hydrogen and oxygen is used as an atmosphere in a furnace so that the density of oxygen in the furnace can be regulated. Thereby, the density of oxygen can be controlled promptly by changing the amount of hydrogen and oxygen supplied to the furnace. For example, if the density of oxygen in the furnace becomes higher than an optimal value, the density can be lowered to the optimal value promptly by decreasing the amount of oxygen or increasing the amount of hydrogen supplied to the furnace.

The main constituent of the atmosphere in the furnace is carbon monoxide gas and/or carbon dioxide gas, and the atmosphere in the furnace is stabilized by keeping the balance of carbon monoxide, carbon dioxide, hydrogen and oxygen. In a conventional method, on the other hand, a mixed gas is used which contains nitrogen as its main constituent, and further contains hydrogen and oxygen, and the atmosphere in the furnace is stabilized by keeping the balance of hydrogen and oxygen. Compared with such a conventional method, in the method according to the present invention, the atmosphere in the furnace has good stabilization and evenness.

Further, according to the present method, the purity of the carbon monoxide or carbon dioxide is 99.9% or more. Conventionally, since impurities such as steam and oxygen have been contained in the atmosphere in the furnace at not a little percentage, it has been impossible to detect the density of oxygen accurately. For this reason, conventionally, it has been difficult to maintain the optimal atmosphere for sintering at a temperature of 600° C. or less. However, according to the present invention, because of very little impurities, the optimal atmosphere, even for sintering at a temperature of 600° C. or less, can be maintained, which guarantees both stability and high quality of finished products. Likewise, for sintering at a temperature of more than 600° C., an optimal atmosphere can be maintained by controlling the gas supplied to the furnace without considering impurities, more specifically, by changing the amount of hydrogen and/or oxygen supplied to the furnace.

In the method according to the present invention, both mixture and reaction of constituents of the atmosphere in a furnace are quick, and the regulation of the atmosphere is easy and accurate. Therefore, the density of oxygen in the furnace can always be set at an optimal value, which value depends both on conditions of heat treatment to which objects of the sintering were subjected in the previous processes, and on the volume of the objects.

Thus, even if an inexpensive base metal is used as the material of the inner electrodes, both an increase in the resistance of the inner electrodes and diffusion of the material of the inner electrodes into the ceramic with oxidation of the material can be prevented, and, as finished products, laminate type electronic devices of high quality, with a fixed capacity, can be obtained.

In other words, laminate-type electronic devices which have inner electrodes made of a base metal or a base metal alloy and are produced by the method according to the present invention fully bring out the advantages of non-migration and low cost.

BRIEF DESCRIPTION OF THE DRAWINGS

This and other objects and features of the present invention will be apparent from the following description with reference to the accompanying drawings, in which.

DETAILED DESCRIPTION OF THE PREFERRED EMBODIMENTS

An exemplary method of producing a laminate-type electronic device is hereinafter described with reference to the accompanying drawings. In the following embodiment, the present invention is applied to a laminate-type ceramic capacitor.

Figure 1:
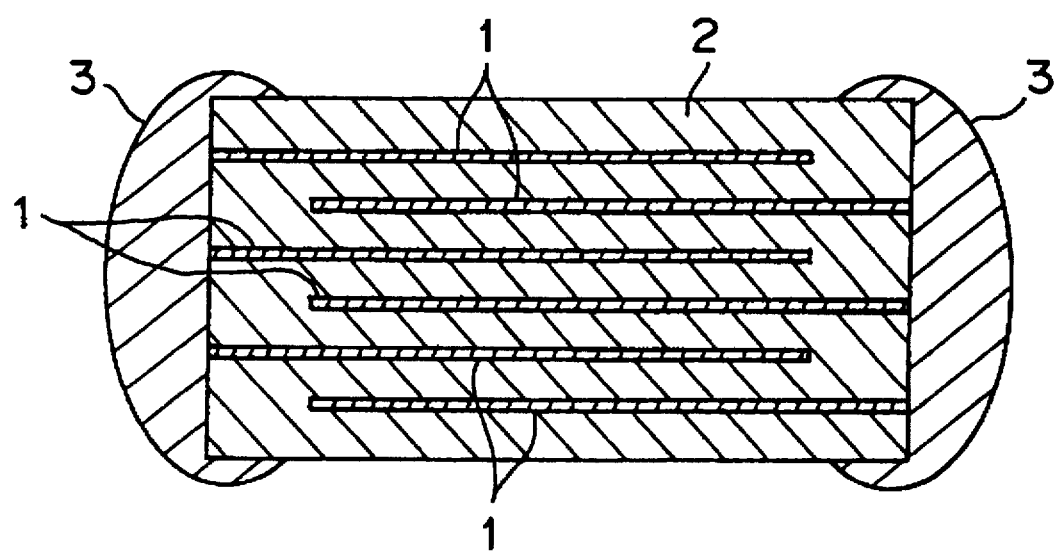
FIG. 1 is a sectional view of a laminate-type ceramic capacitor produced by a method according to the present invention.

Referring to FIG. 1, the structure of a laminate-type ceramic capacitor is described. The ceramic capacitor comprises a plurality of dielectric ceramic sheets 2, a plurality of inner electrodes 1, and a pair of outer electrodes 3. The ceramic sheets 2 and the inner electrodes 1 are laminated alternately such that a capacity is generated between two adjoining inner electrodes 1. The outer electrodes 3 are connected to a specified one of the inner electrodes 1 so as to take the capacity out thereof. The dielectric ceramic sheets 2 are made of a non-reducing dielectric material. The inner electrodes 1 are made of an inexpensive base metal, or, alternatively, base-metal alloy. The outer electrodes 3 are made of nickel, copper, an alloy of nickel and copper, copper with glass frit, a copper alloy, silver, palladium, an alloy of silver and palladium, or the like. The material of the outer electrodes 3 is determined depending on the use of the ceramic capacitor.

An experiment was conducted to find out what types of gases should be used as the atmosphere for sintering of laminates made of the above-described materials to obtain a ceramic capacitor with fine characteristics. The following describes the method and the result of the experiment.

First, laminates to be subjected to sintering in different conditions were fabricated as follows:

PbO, $MgCO_3$, $Nb_2O_5$, $TiO_2$ and ZnO were mixed in suitable ratios to obtain dielectric powder composed of 92 mol % of $Pb(Mg_{1/3}Nb_{1/3})O_3$, 2 mol % of $Pb(Zn_{1/2}Nb_{1/2})O_3$ and 6 mol % of $PbTiO_3$. These constituents were wet-blended in a ball mill for 16 hours, evaporated and dried to powder. The powder was put into a zirconium pot and sintered at a temperature within a range from 680° C. to 730° C. for two hours. The sintering solidified the powder, and, after the sintering, the solid was ground to sift through a 200-mesh sieve. Thus, dielectric powder containing lead oxide was obtained.

A sintering promoter composed of 7 mol % of $Li_2O$, 42 mol % of BaO, 22 mol % of $B_2O_3$ and 29 mol % of $SiO_2$ (refer to Japanese Patent Laid Open Publication No. 63-151658) was added to the dielectric powder in a ratio of 1.0 wt %. Further, an acrylic organic binder, a plasticizer and an organic solvent were added, and the powder and these agents were wet-blended in a ball mill for 16 hours. Thus, slurry was obtained. Then, the slurry was made into green sheets with a thickness of 35 μm by the doctor blade method.

The inner electrodes 1 were made of conductive paste of which the main constituent was copper (composed of grains with an average diameter of 1 μm). The conductive paste was prepared by adding an organic binder and kneading, by use of three rolls, to have suitable viscosity.

The conductive paste was screen-printed on the green sheets made in the above-described manner, and, thus, inner electrode patterns were formed on the green sheets. A required number of green sheets, having the inner electrode patterns thereon, were laminated such that the inner electrodes faced one another, and the laminated green sheets were fixed together by thermal pressing. Thus, a laminate was obtained, and the laminate was cut into pieces of a specified size. In this way, a laminate of green sheets, as shown in FIG. 1, was fabricated.

Figure 2:
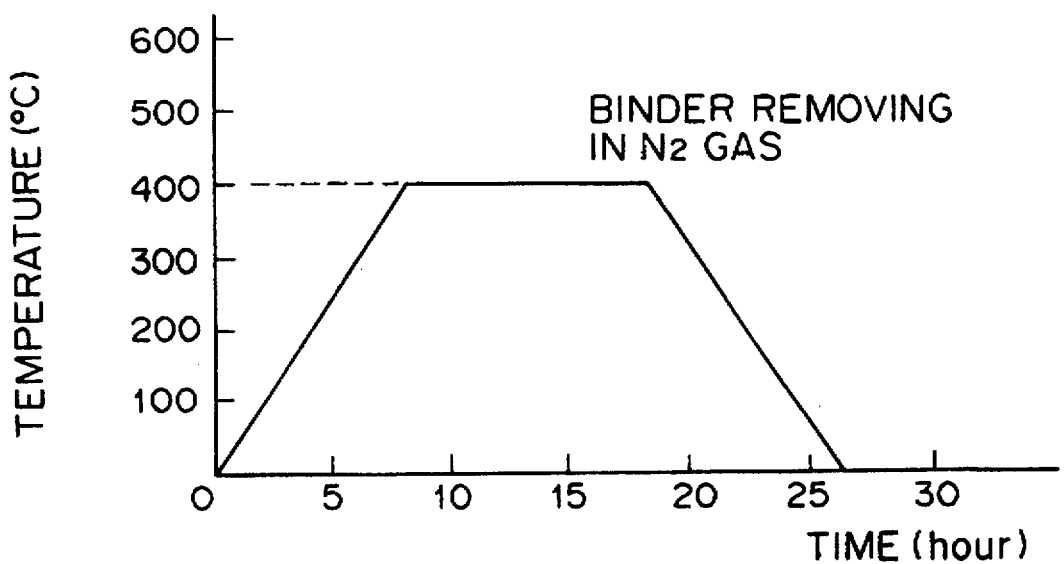
FIG. 2 is a graph showing a temperature profile in a binder-removing step.

Next, thusly fabricated laminates were placed on a magnesium plate with no overlaps and were exposed to heat in a tubular furnace so as to remove the organic binder contained in the laminates. More specifically, for thermal decomposition of the binder, the laminates were exposed to an atmosphere with a low density of oxygen at a temperature of 400° C. for 10 hours. The speed of raising the temperature was 50° C. per hour. (The temperature of the atmosphere must be at least a temperature at which the binder is decomposed. However, if the temperature is too high, copper contained in the conductive paste will oxidize to be copper oxide or cupric oxide and will diffuse into the ceramic. In order to avoid this trouble, thermal analysis of the binder had been made beforehand, and a temperature profile had been made according to the analysis FIG. 2 shows the profile.)

Laminates made through all the above steps were divided into six lots and subjected to sintering in different conditions.

Figure 3:
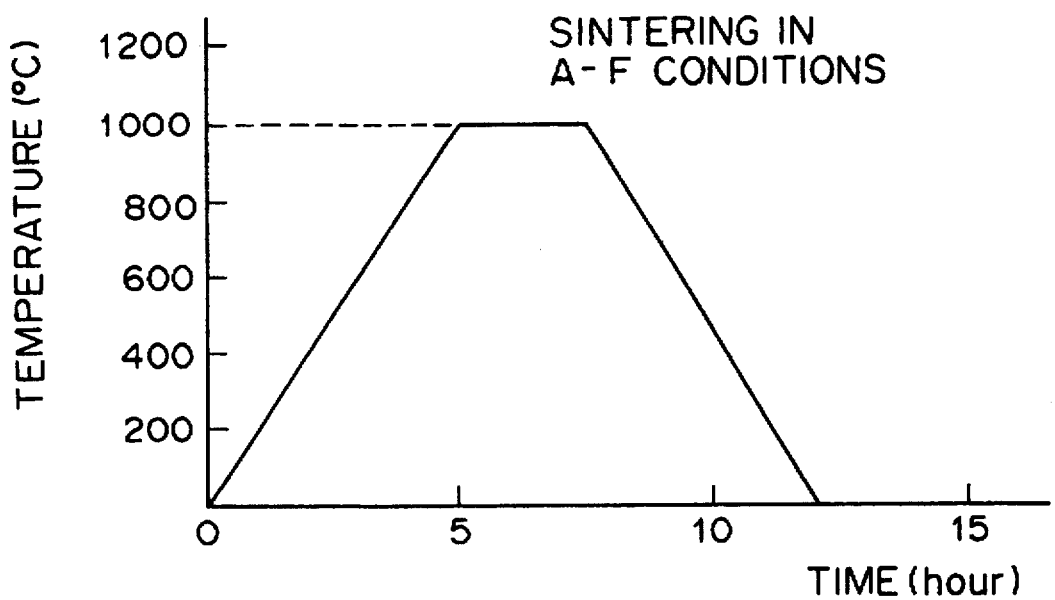
FIG. 3 is a graph showing a temperature profile in a sintering step.

Referring now to Table 1, below, conditions A, B and C were according to the present invention. In condition A, laminates were subjected to sintering at a temperature of 1000° C. for 2 hours in a mixed gas containing carbon dioxide with a purity of 99.99% as its main constituent and little hydrogen and oxygen. The density of oxygen in the furnace was measured by a zirconium oxygen sensor, and the density of oxygen was regulated to $10^{-7}$ atm while the temperature inside the furnace was 1000° C. FIG. 3 shows a temperature profile during the sintering.

In condition B, laminates were subjected to sintering in a mixed gas of which the main constituent was carbon dioxide with a purity of 99.90%. In condition C, laminates were subjected to sintering in a mixed gas of which the main constituent was carbon monoxide with a purity of 99.99%.

Conditions D, E and F, which were not according to the present invention, were set for comparison. In condition D, sintering was carried out in a mixed gas of which the main constituent was carbon dioxide with a low purity of 99.50%. In condition E, sintering was carried out in a mixed gas of which the main constituent was nitrogen with a purity of 99.999%. In condition F, which was according to a conventional method, sintering was carried out in a mixed gas which contained carbon dioxide with a purity of 99.50% and carbon monoxide with a purity of 99.50% as its main constituents.

Table 1 shows the details of the conditions.

TABLE 1

| Condition | Main Constituent | Purity (%) | Other Constituents | Partial Pressure of Oxide (1000° C.) |
|---|---|---|---|---|
| A | $CO_2$ | 99.99 | $H_2, O_2$ | $1 \times 10^{-7}$ atm |
| B | $CO_2$ | 99.90 | $H_2, O_2$ | $1 \times 10^{-7}$ atm |
| C | CO | 99.99 | $H_2, O_2$ | $1 \times 10^{-7}$ atm |
| D | $CO_2$ | 99.50 | $H_2, O_2$ | $1 \times 10^{-7}$ atm |
| E | $N_2$ | 99.999 | $H_2, O_2$ | $1 \times 10^{-7}$ atm |
| F | $CO_2 + CO$ | 99.50 | $H_2, O_2$ | $1 \times 10^{-7}$ atm |

After the sintering in each condition, both sides of each laminate were coated with copper paste and baked in nitrogen gas at a temperature of 650° C. for 2 hours. Thus, outer electrodes were formed.

Obtained in this way were laminate-type ceramic capacitors with the following size and structure:

measurements
  length: 3.2 mm
  width: 1.6 mm
  thickness: 1.2 mm
effective thickness of a dielectric layer: 20 μm
number of active dielectric layers: 19
effective thickness of an inner electrode: 3 μm
effective area of an inner electrode: 2.88 mm²

The characteristics of the laminate-type ceramic capacitors sintered in the different conditions were evaluated. More specifically, capacitance, dielectric loss, and insulation resistance, both in the initial state and after aging, were measured. Aging of the ceramic capacitors was made by applying a direct current of 50V to the ceramic capacitors and keeping them in an atmosphere with a temperature of 70° C. and a relative humidity of 85% for 1000 hours. Table 2 shows the result of the evaluation. The evaluation was made in connection with 20 samples sintered in each condition. In Table 2, an average of measured values in connection with the 20 samples is indicated. In calculating the average, samples which short-circuited were not considered.

TABLE 2

| Condition | | Capacitance (pF) | | Dielectric Loss tan δ (%) | | Insulation Resistance (Ω) | | Dielectric Constant | | Number of Short Circuits |
|---|---|---|---|---|---|---|---|---|---|---|
| | | $\bar{x}$ | 3 CV | $\bar{x}$ | 3 CV | $\bar{x}$ | 3 CV | $\bar{x}$ | 3 CV | N/50 |
| A | initial state | 80500 | 4.2 | 1.70 | 3.2 | $5.7 \times 10^{10}$ | 3.8 | 14100 | 3.3 | 0 |
|   | after aging | 79500 | 4.4 | 1.78 | 3.3 | $4.8 \times 10^{10}$ | 4.2 | 13900 | 3.5 | 0 |
| B | initial state | 78500 | 4.6 | 1.75 | 3.7 | $4.8 \times 10^{10}$ | 3.9 | 13800 | 3.6 | 0 |
|   | after aging | 78000 | 4.9 | 1.77 | 3.8 | $4.3 \times 10^{10}$ | 4.1 | 13700 | 3.6 | 0 |
| C | initial state | 81000 | 3.7 | 1.65 | 3.5 | $5.0 \times 10^{10}$ | 3.5 | 14200 | 3.2 | 0 |
|   | after aging | 80500 | 3.8 | 1.67 | 3.9 | $4.5 \times 10^{10}$ | 3.9 | 14100 | 3.3 | 0 |
| D | initial state | 55500 | 26.5 | 2.75 | 5.8 | $7.5 \times 10^{9}$ | 22.3 | 9700 | 21.6 | 0 |
|   | after aging | 54000 | 33.5 | 3.68 | 6.1 | $6.5 \times 10^{6}$ | 41.5 | 9500 | 23.4 | 46 |
| E | initial state | 62000 | 22.6 | 2.25 | 5.4 | $3.5 \times 10^{10}$ | 28.6 | 10900 | 18.5 | 0 |
|   | after aging | 60000 | 31.8 | 2.40 | 7.1 | $2.8 \times 10^{6}$ | 50.1 | 10500 | 21.9 | 39 |
| F | initial state | 65000 | 23.5 | 2.05 | 5.5 | $9.5 \times 10^{9}$ | 19.8 | 11400 | 20.2 | 0 |
|   | after aging | 64000 | 28.7 | 2.30 | 8.2 | $3.4 \times 10^{6}$ | 43.3 | 11200 | 24.6 | 43 |

[3 CV = (3 δ/$\bar{x}$) × 100%]

As is apparent from Table 2, the ceramic capacitors made by the methods according to the present invention (in conditions A, B and C) have fine characteristics, and their performance is practically sufficient. Even after aging, the characteristics are almost the same as those in the initial state, and, therefore, these ceramic capacitors can be considered to be highly reliable. These ceramic capacitors have better characteristics than the ceramic capacitors made by the comparative methods (conditions D, E and F), both in the initial state and after aging.

As is evident from the result, it is very effective to attain fine characteristics and reliability of laminate type ceramic capacitors that sintering of laminates is carried out in a mixed gas containing carbon monoxide or carbon dioxide with a purity of 99.9% or more as its main constituent and little hydrogen and oxygen.

Additionally, the insides of ceramic capacitors sintered in the different conditions were examined. The ceramic capacitors made by the methods according to the present invention had light yellow dielectric layers, as can be seen when a laminate of dielectric sheets with no electrodes thereon is sintered. On the other hand, the dielectric layers of the ceramic capacitors made by the comparative methods were entirely reddish yellow and had red segregation locally. Apparently, this color change was caused by diffusion of copper oxide into the dielectric layers.

Carbon monoxide or carbon dioxide with a purity of 99.9% or more is used as the main constituent of the atmosphere of sintering for the following reasons:

As is evident from the above-described experiment, laminate-type ceramic capacitors which are produced through a sintering step carried out in an atmosphere containing carbon monoxide or carbon dioxide with a purity of 99.9% or more as its main constituent have fine characteristics, not only in the initial state but also after aging. Additionally, diffusion of copper oxide into ceramic is not remarkable in the sintering. On the other hand, laminate-type ceramic capacitors which are produced through a sintering step, carried out in an atmosphere containing carbon monoxide or carbon dioxide with a purity less than 99.9% as its main constituent have poor characteristics. This results from an unstable atmosphere of sintering. In this case, impurities contained in the carbon monoxide or carbon dioxide gas, such as oxide and steam, make the atmosphere unstable. Further, laminate-type ceramic capacitors which are produced through a sintering step carried out in an atmosphere containing nitrogen as its main constituent have poor characteristics. In this case, the density of oxygen is regulated by controlling only mutual reaction of hydrogen and oxygen, and the regulation by this control is more difficult than regulation of the density of oxygen in a case wherein carbon monoxide or carbon dioxide is used as the main constituent.

In the embodiment above, the present invention is applied to a laminate-type ceramic capacitor which has inner electrodes made of copper. However, the present invention is applicable to any laminate-type ceramic electronic device, for example, a laminate-type CR composite device, inductor, varistor, etc., which has inner electrodes made of a base metal or a base-metal alloy. Not all the ceramic sheets, but at least sheets which will be in contact with inner electrodes made of a base-metal or a base-metal alloy must be made of a non-reducing ceramic material.

Although the present invention has been described in connection with the preferred embodiment above, it is to be noted that various changes and modifications are possible to those who are skilled in the art. Such changes and modifications are to be understood as being within the scope of the invention.

What is claimed is:

1. A method of producing a laminated electronic device, comprising the steps of:

laminating together ceramic green sheets having inner electrodes comprising a base metal thereon, wherein at least some of the green sheets are made from a sintered mixture of PbO, $MgCO_3$, $Nb_2O_5$, $TiO_2$ and ZnO to form a laminate;

sintering the laminate in a mixed gas which contains carbon dioxide with a purity of at least 99.9% and carbon monoxide with a purity of at least 99.9%, as its main constituents, and which further contains hydrogen and oxygen, and wherein a supply of at least one of the hydrogen and oxygen is regulated to control a density of oxygen in the mixed gas.

2. A method of producing a laminated electronic device, as recited in claim 1, wherein the step of sintering is carried out at a temperature of 600° C. or less.

3. A method of producing a laminated electronic device, as recited in claim 1, wherein the step of laminating together ceramic green sheets comprises printing a conductive paste, of which a main constituent comprises copper, on the ceramic green sheets in specified patterns so as to form the inner electrodes.

4. A method of producing a laminated electronic device comprising the steps of:

laminating together ceramic green sheets having inner electrodes comprising a base metal thereon, wherein at least some of the green sheets are made of a non-reducing ceramic material to form a laminate;

sintering the laminate in a mixed gas which contains carbon monoxide with a purity of at least 99.9%, as its main constituent, and which further contains hydrogen and oxygen, wherein a supply of at least one of the hydrogen and oxygen is regulated to control a density of oxygen in the mixed gas.

5. A method of producing a laminated electronic device, comprising the steps of:

laminating together ceramic green sheets having inner electrodes comprising a base metal thereon, at least some of the ceramic sheets being made of a non-reducing ceramic material, to form a laminate;

sintering the laminate at a temperature of 600° C. or less in a mixed gas which contains at least one of carbon dioxide with a purity of at least 99.9% and carbon monoxide with a purity of at least 99.9%, as its main constituent, and which further contains hydrogen and oxygen, wherein a supply of at least one of the hydrogen and oxygen is regulated to control a density of oxygen in the mixed gas.

6. A method of producing a laminated electronic device, as recited in claim 5, wherein the mixed gas contains carbon dioxide with a purity of at least 99.9% as its main constituent.

7. A method of producing a laminated electronic device, as recited in claim 5, wherein the mixed gas contains carbon monoxide with a purity of at least 99.9% as its main constituent.

* * * * *